United States Patent
Pan et al.

(10) Patent No.: US 10,177,769 B2
(45) Date of Patent: Jan. 8, 2019

(54) MAGNETOELECTRIC COMPUTATIONAL DEVICES

(71) Applicant: Georgia Tech Research Corporation, Atlanta, GA (US)

(72) Inventors: Chenyun Pan, Atlanta, GA (US); Sourav Dutta, Atlanta, GA (US); Azad Naeemi, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 15/959,700

(22) Filed: Apr. 23, 2018

(65) Prior Publication Data

US 2018/0248554 A1 Aug. 30, 2018

Related U.S. Application Data

(62) Division of application No. 15/654,278, filed on Jul. 19, 2017, now Pat. No. 9,979,401.

(60) Provisional application No. 62/363,876, filed on Jul. 19, 2016.

(51) Int. Cl.
| | |
|---|---|
| *H01F 10/32* | (2006.01) |
| *H03K 19/20* | (2006.01) |
| *H01F 10/14* | (2006.01) |
| *H01F 10/16* | (2006.01) |
| *H01L 27/22* | (2006.01) |
| *H01L 43/02* | (2006.01) |
| *H01L 43/08* | (2006.01) |
| *H01L 43/10* | (2006.01) |

(52) U.S. Cl.
CPC ............. *H03K 19/20* (2013.01); *H01F 10/14* (2013.01); *H01F 10/16* (2013.01); *H01F 10/3218* (2013.01); *H01L 27/22* (2013.01); *H01L 27/222* (2013.01); *H01L 43/02* (2013.01); *H01L 43/08* (2013.01); *H01L 43/10* (2013.01)

(58) Field of Classification Search
CPC .......... H01F 10/08; H01F 10/10; H01F 10/12; H01F 10/14; H01F 10/3218
See application file for complete search history.

(56) References Cited

U.S. PATENT DOCUMENTS

| | | | | |
|---|---|---|---|---|
| 7,999,338 B2 * | 8/2011 | Zheng | ............. | B82Y 25/00 257/414 |
| 8,772,886 B2 * | 7/2014 | Huai | ............. | B82Y 25/00 257/421 |
| 9,646,666 B2 * | 5/2017 | Datta | ............. | G11C 11/161 |
| 9,979,401 B2 * | 5/2018 | Pan | ............. | H03K 19/20 |
| 2007/0228501 A1 * | 10/2007 | Nakamura | ............. | B82Y 25/00 257/421 |

(Continued)

*Primary Examiner* — Jason Crawford
(74) *Attorney, Agent, or Firm* — Troutman Sanders LLP; Ryan A. Schneider

(57) ABSTRACT

Embodiments of the present invention relate generally to logic devices, and more particularly, to magnetoelectric magnetic tunneling junction computational devices. Aspects of the disclosed technology include a stand-alone voltage-controlled magnetoelectric device that satisfies essential requirements for general logic applications, including non-linearity, gain, concatenability, feedback prevention, and a complete set of Boolean operations based on the majority gate and inverter. Aspects of the present disclosed technology can eliminate the need for any auxiliary FETs to preset or complicated clocking schemes and prevents the racing condition.

17 Claims, 11 Drawing Sheets

(56) References Cited

U.S. PATENT DOCUMENTS

| | | | |
|---|---|---|---|
| 2009/0067224 A1* | 3/2009 | Hochstrat | H01L 43/08 |
| | | | 365/158 |
| 2013/0187247 A1* | 7/2013 | Wu | G11C 11/161 |
| | | | 257/421 |
| 2017/0104151 A1* | 4/2017 | Banerjee | H01L 43/065 |
| 2017/0125078 A1* | 5/2017 | Mihajlovic | G11C 11/161 |
| 2017/0294573 A1* | 10/2017 | Hu | H01L 43/08 |

* cited by examiner

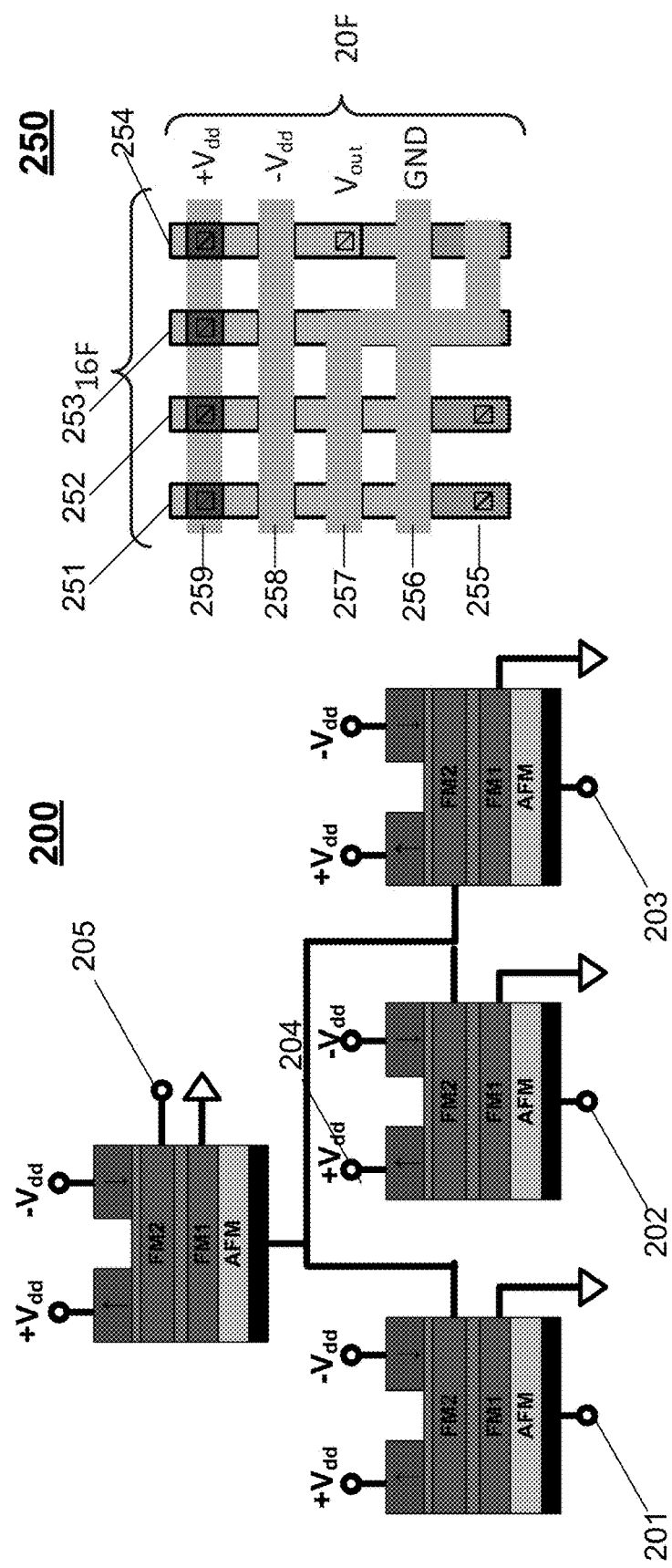

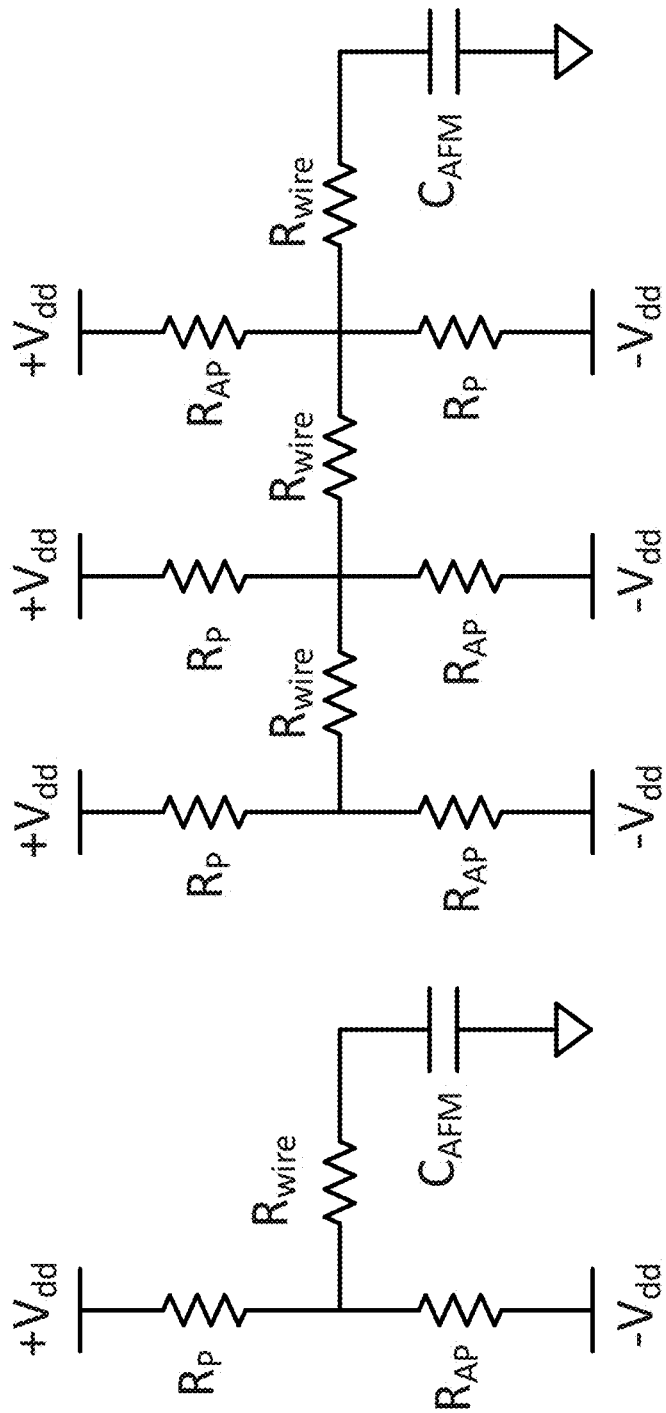

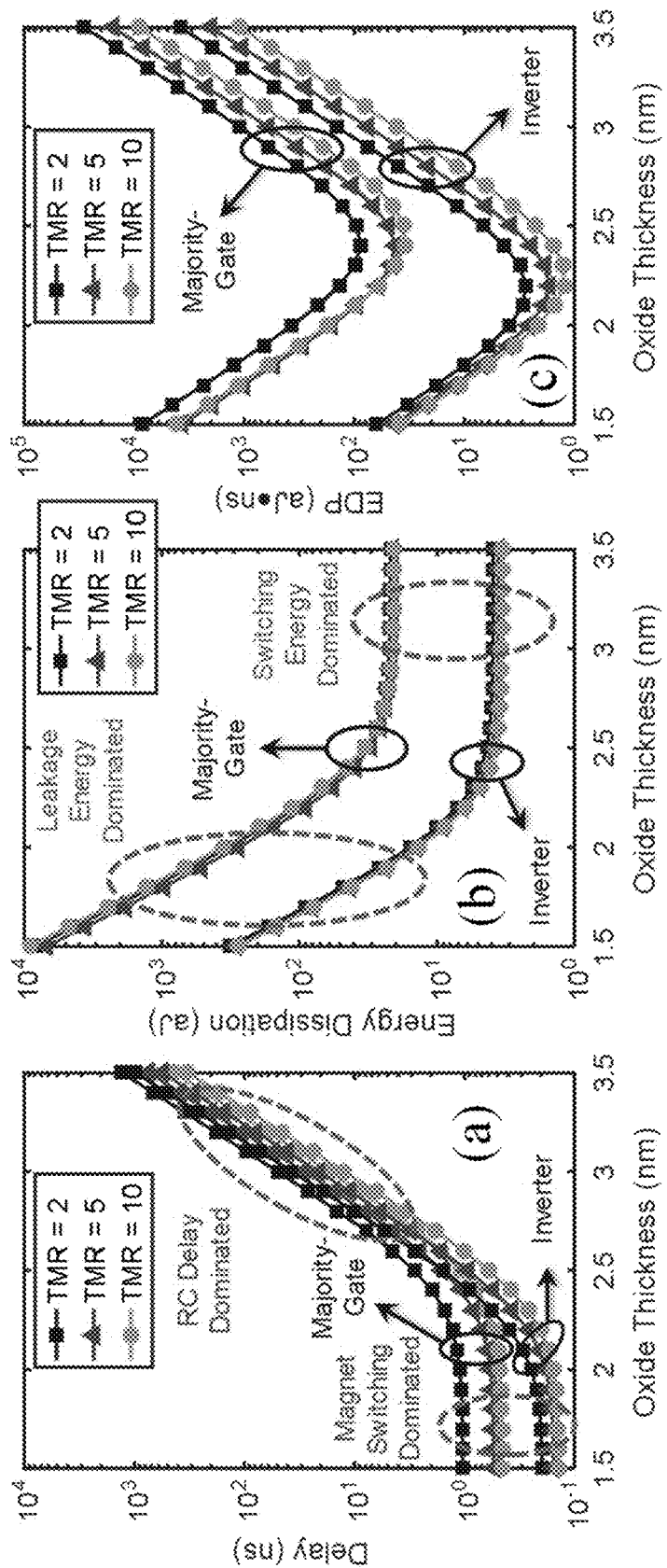

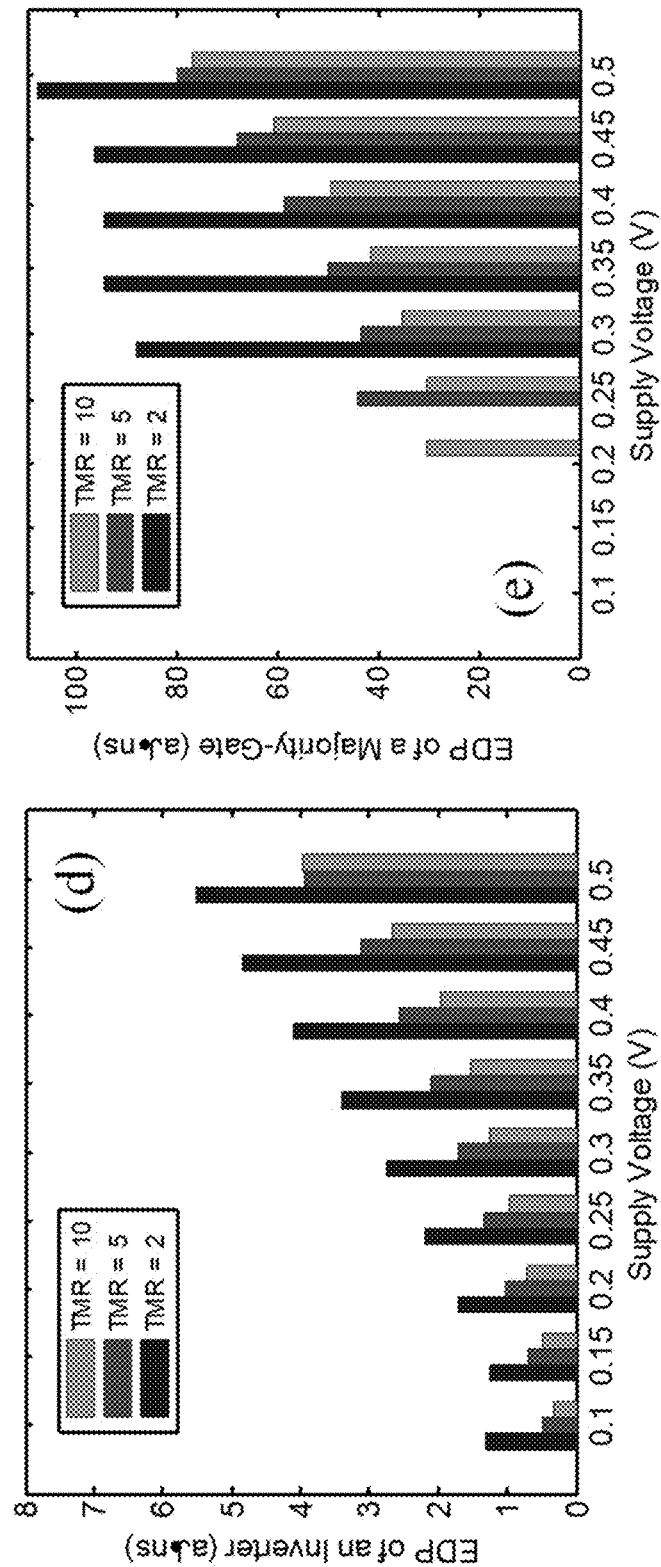

MAGNETOELECTRIC COMPUTATIONAL DEVICES

CROSS-REFERENCE TO RELATED APPLICATION

This Application is a divisional application of, and claims priority under 35 USC § 120 to, U.S. patent application Ser. No. 15/654,278, filed 19 Jul. 2017. U.S. patent application Ser. No. 15/654,278 claims priority under 35 USC § 119(e) to U.S. Provisional Patent Application No. 62/363,876, filed 19 Jul. 2016. The contents of each of which are hereby incorporated in their entirety as if fully set forth herein.

STATEMENT REGARDING FEDERALLY SPONSORED RESEARCH

This invention was made with government support under Cooperative Agreement No. 70NANB12H107 awarded by NIST. The government has certain rights in the invention.

TECHNICAL FIELD

Embodiments of the present invention relate generally to logic devices, and more particularly, to magnetoelectric magnetic tunneling junction (MEMTJ) computational devices.

BACKGROUND

There is a critical need for a stand-alone, low-power, voltage-controlled, non-volatile logic device capable of performing logic functions with low switching and static power dissipation. A need exists for logic devices beyond CMOS that can complement or even replace CMOS technology to sustain exponential growth in chips throughput. Magnetic devices have been at the center of this search as they provide new features such as non-volatility and low-voltage operation.

Existing MEMTJ devices use a magnetoelectric antiferromagnetic (AFM) layer stacked with a magnetic tunnel junction (MTJ) made of a material such as Chromia ($Cr_2O_3$). The boundary magnetization of $Cr_2O_3$ can be isothermally controlled via an applied electric field. The generated voltage-controlled perpendicular exchange bias can be used to switch an adjacent ferromagnetic layer. The magnetization of the free magnet determines the output MTJ resistance. By using a field-effect transistor (FET) at the output, the MTJ resistance can be converted back to voltage, which drives the next stage. However, exiting MEMTJ logic devices have several drawbacks. First, each device needs multiple dedicated MOSFETs to drive the next stage, which increases the area/delay/energy overheads. Second, a preset and clocking scheme is required to perform logic functions since the output voltage is only positive. Third, the devices are very sensitive to the insulator thickness variability because the output voltage is determined by the voltage division between the FET and the MTJ. Any variation in the insulator thickness changes the MTJ resistance exponentially, therefore, would shift the output voltage significantly.

In sum, existing current-driven magnetic and spintronic devices require high current densities. These high current densities increase power dissipation, cause reliability issues, and lead to static power dissipation. Voltage-controlled magnetoelectric magnetic tunneling junction (MEMTJ) devices are expected to dissipate orders of magnitude less energy per binary switching operation compared to current-controlled magnetic devices. However, existing MEMTJ devices are not concatenable. Instead, connecting multiple MEMTJ devices together requires multiple field effect transistors to reset the devices at the beginning of each clock cycle and to drive subsequent logic stages.

What is needed, therefore, is an improved MEMTJ that allows concatenation, and does not require substantial additional devices to support their operation. Embodiments of the present invention address this need as well as other needs that will become apparent upon reading the description below in conjunction with the drawings.

BRIEF SUMMARY

Aspects of the disclosed technology can address one or more of the problems identified above. The currently disclosed technology includes a stand-alone voltage-controlled magnetic device that satisfies all five essential requirements for general logic applications, including nonlinearity, gain, concatenability, feedback prevention, and a complete set of Boolean operations based on the majority gate and inverter. Embodiments of the disclosed technology eliminate the need for any auxiliary FETs and substantially reduces static power dissipation.

Aspects of the present disclosure include a semiconductor device, comprising an input electrode and a ground electrode configured to produce an electric field within a layer of antiferromagnetic material when a voltage is applied to the input electrode relative to the ground electrode, wherein the layer of antiferromagnetic material produces an effective magnetic field in response to the application of an electric field, a first free magnet and a second free magnet, wherein the first and second free magnet are separated by a first isolation layer, wherein the first free magnet is in magnetic communication with the layer of antiferromagnetic material, and wherein the second free magnet is magnetically coupled to the first free magnet, a permanent magnet in contact with a second isolation layer, wherein the second isolation layer is in contact with the second free magnet, a digital voltage electrode in electrical communication with the first permanent magnet, and an output electrode in electrical communication with the second free magnet.

Some embodiments further comprise a second permanent magnet in contact with a third isolation layer, wherein the third isolation layer is in contact with the second free magnet, and a second digital voltage electrode in electrical communication with the second permanent magnet, wherein a magnetoresistance between the first digital electrode and ground is different than a magnetoresistance between the second digital electrode and ground depending on the magnetic orientation of the permanent magnets. In some embodiments, a voltage applied to the second digital voltage electrode has a substantially equal magnitude and opposite polarity as the voltage applied to the digital voltage electrode relative to ground. In some embodiments, the input electrode is in electrical communication with the antiferromagnetic layer, and wherein the ground electrode is in electrical communication with the first free magnet. In some embodiments, the input electrode is in electrical communication with the first free magnet, and wherein the ground electrode is in electrical communication with the antiferromagnetic layer. In some embodiments, the second free magnet is coupled to the first free magnet by exchange coupling. In some embodiments, the second free magnet is coupled to the first free magnet by dipole coupling. Some embodiments further comprise a second input electrode, wherein the second electrode is configured to produce an electric field within the layer of antiferromagnetic material when a voltage is applied to the second input electrode relative to the ground electrode. In some embodiments, the first isolation layer has a thickness selected to suppress leakage current from the digital voltage electrode to the ground electrode. In some embodiments, the second isolation layer has a thickness selected to permit electron tunneling between the digital voltage electrode and the output electrode when the polarity of the first permanent magnet and the second free magnet are similarly directed. In some embodiments, a thickness of the first isolation layer is approximately two times to three times a thickness of the second isolation layer. In some embodiments, the permanent magnet comprises a layer comprised, at least in part, of an alloy of cobalt and iron, and a layer comprised, at least in part, of an alloy of iridium and magnesium. In some embodiments, the antiferromagnetic layer comprises a material selected from the group of chromium oxide, bismuth ferrite, and combinations thereof. In some embodiments, the first free magnet comprises a material selected from the group of cobalt iron alloys, cobalt palladium alloys, lanthanum strontium manganite, and combinations thereof. In some embodiments, the first isolation layer comprises a material selected from the group of magnesium oxide, yttrium-aluminum-garnet, iron oxide, and combinations thereof. In some embodiments, the second isolation layer comprises a material selected from the group of magnesium oxide, aluminum oxide, and combinations thereof.

Aspects of the present disclosure include a semiconductor device, comprising a first logic gate comprising, an input electrode and a ground electrode configured to produce an electric field within a layer of antiferromagnetic material when a voltage is applied to the input electrode relative to the ground electrode, wherein the layer of antiferromagnetic material produces a magnetic field in response to the application of an electric field, a first free magnet and a second free magnet, wherein the first and second free magnet are separated by a first isolation layer, wherein the first free magnet is in magnetic communication with the layer of antiferromagnetic material, and wherein the second free magnet is magnetically coupled to the first free magnet, a permanent magnet in contact with a second isolation layer, wherein the second isolation layer is in contact with the second free magnet, a digital voltage electrode in electrical communication with the first permanent magnet, and an output electrode in electrical communication with the second free magnet, and a second logic gate, comprising an input electrode and a ground electrode configured to produce an electric field within a layer of antiferromagnetic material when a voltage is applied to the input electrode relative to the ground electrode, wherein the layer of antiferromagnetic material produces a magnetic field in response to the application of an electric field, a first free magnet and a second free magnet, wherein the first and second free magnet are separated by a first isolation layer, wherein the first free magnet is in magnetic communication with the layer of antiferromagnetic material, and wherein the second free magnet is magnetically coupled to the first free magnet, a permanent magnet in contact with a second isolation layer, wherein the second isolation layer is in contact with the second free magnet, and a digital voltage electrode in electrical communication with the first permanent magnet, and an output electrode in electrical communication with the second free magnet, wherein the input electrode of the first logic device is in electrical communication with the antiferromagnetic layer of the first logic device, and the ground electrode of the first logic is in electrical contact with the first free magnet of the first logic device, wherein the input electrode of the second logic device is in electrical communication with the first free magnet of the second logic device, and the ground electrode of the second logic device is in electrical contact with the antiferromagnetic layer of the second logic device, and wherein the output electrode of the first logic device is in electrical communication with the output electrode of the second logic device.

Aspects of the present disclosure include a semiconductor device, comprising a logic component, comprising an input electrode and a ground electrode configured to produce an electric field within a layer of antiferromagnetic material that produces a magnetic field in response to the application of an electric field, a free magnet and a permanent magnet, wherein the free magnet and permanent magnet are separated by a magnet isolation layer, wherein the free magnet is in magnetic communication with the layer of antiferromagnetic material and an output electrode in electric communication with the permanent magnet, a bias component, comprising a first pre-set electrode and a second pre-set electrode configured to produce an electric field within a layer of antiferromagnetic material that produces a magnetic field in response to the application of an electric field, a free magnet and a permanent magnet, wherein the free magnet and the permanent magnet are separated by a magnet isolation layer, wherein the free magnet is in magnetic communication with the layer of antiferromagnetic material, and an output electrode in electric communication with the permanent magnet, wherein the output electrode of the bias component is in electrical communication with the output electrode of the logic component, wherein the logic component is configured to be pre-set by applying a ground voltage to the first pre-set electrode and a pre-set voltage to the second pre-set electrode, wherein the logic component is configured to be operable by applying an operating voltage to the second pre-set electrode, and a voltage approximately double the operating voltage to the first pre-set electrode, wherein the operating voltage has an opposite polarity from the pre-set voltage.

In some embodiments, the permanent magnet and free magnet of the bias component have parallel polarities. In some embodiments, pre-setting the logic component comprises magnetizing the first free magnet of the logic component. In some embodiments, the logic component of the semiconductor device further comprises a second input electrode configured to produce an electric field within the layer of antiferromagnetic material of the logic component when a voltage is applied to the second input electrode relative to ground. In some embodiments, the input electrode of the logic component is in electric communication with the free magnet of the logic component, and wherein the ground electrode of the logic component is in electric communication with the antiferromagnetic layer of the logic component. In some embodiments, input electrode of the logic component is in electric communication with the antiferromagnetic layer of the logic component, and wherein the ground electrode of the logic component is in electric communication with the free magnet of the logic component. In some embodiments, the magnet isolation layer of the logic component and the magnet isolation layer of the bias component are composed of a material selected to have a high electrical resistivity. In some embodiments, the operating voltage is selected to bias the free magnet of the logic component to have a polarity opposite to the polarization of the permanent magnet of the logic component present when no input is applied to the logic component.

Additional features and advantages of the present invention are set forth in the following detailed description and drawings, may be apparent from the detailed description and drawings, or may be learned by practicing the present invention. Moreover, both the foregoing summary and following detailed description are exemplary and explanatory and are intended to provide further explanation of the presently disclosed invention as claimed.

BRIEF DESCRIPTION OF THE FIGURES

The accompanying drawings, which are incorporated in and constitute a part of this specification, illustrate multiple embodiments of the presently disclosed subject matter and serve to explain the principles of the presently disclosed subject matter. The drawings are not intended to limit the scope of the presently disclosed subject matter in any manner.

FIG. 2A depicts a majority gate composed of MEMTJs in accordance with an embodiment.

FIG. 2B depicts a layout of the majority gate of FIG. 2A on a substrate in accordance with an embodiment.

FIG. 5A illustrates an equivalent circuit for a buffer or inverter constructed from an MEMTJ in accordance with an embodiment.

FIG. 5B illustrates an equivalent circuit for a majority gate constructed from an MEMTJ in accordance with an embodiment.

FIG. 6A depicts the propagation delay of MEMTJs in accordance with embodiments.

FIG. 6B depicts the energy dissipation of MEMTJs in accordance with embodiments.

FIG. 6C depicts the energy delay product of MEMTJs in accordance with embodiments.

FIG. 6D depicts the energy delay product of inverters in accordance with embodiments.

FIG. 6E depicts the energy delay product of majority gates in accordance with embodiments.

DETAILED DESCRIPTION

Figures 1A, 1B:
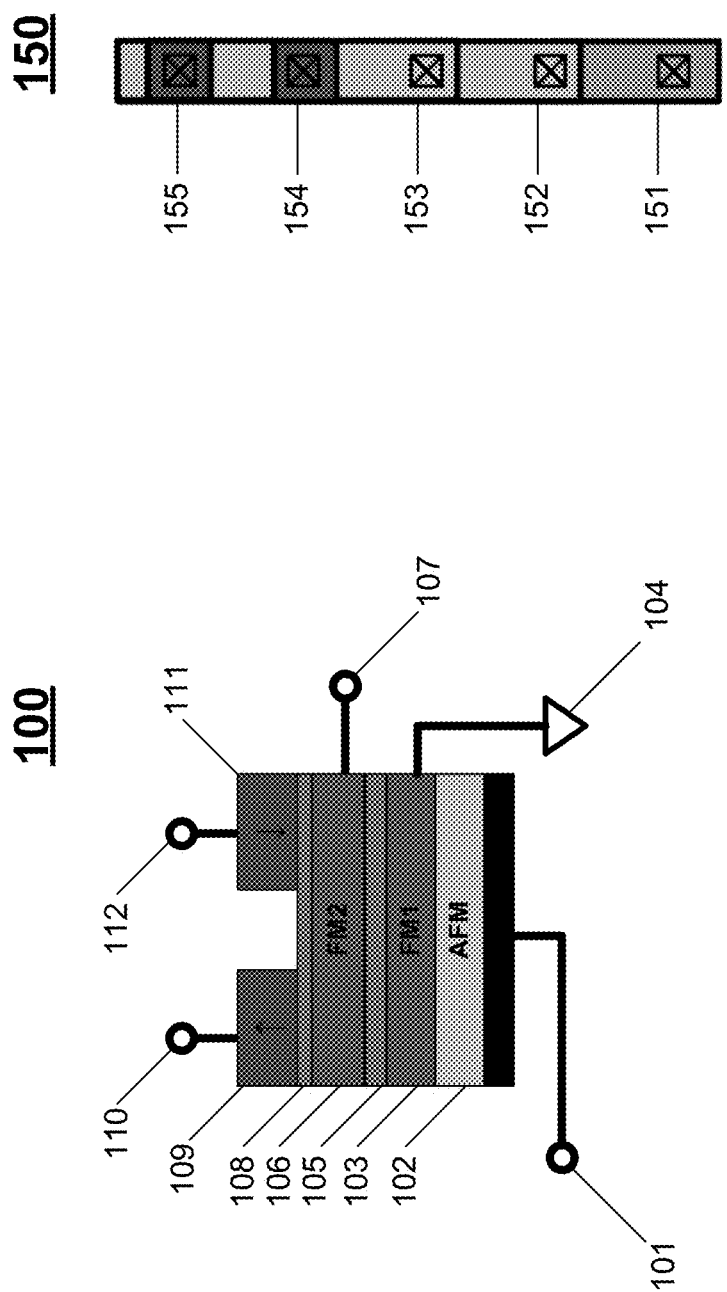
FIG. 1A depicts an MEMTJ device in accordance with an embodiment.
FIG. 1B depicts a layout of an MEMTJ on a substrate in accordance with an embodiment.

Aspects of the disclosed technology include a voltage-controlled magnetoelectric device that satisfies all five essential requirements for general logic applications, including nonlinearity, gain, concatenability, feedback prevention, and a complete set of Boolean operations based on the majority gate and inverter. Some embodiments eliminate the need for any auxiliary FETs to preset or complicated clocking schemes and can prevent race conditions.

Although preferred embodiments of the invention are explained in detail, it is to be understood that other embodiments are contemplated. Accordingly, it is not intended that the invention is limited in its scope to the details of construction and arrangement of components set forth in the following description or illustrated in the drawings. The invention is capable of other embodiments and of being practiced or carried out in various ways. Also, in describing the preferred embodiments, specific terminology will be resorted to for the sake of clarity.

It should also be noted that, as used in the specification and the appended claims, the singular forms "a," "an" and "the" include plural references unless the context clearly dictates otherwise. References to a composition containing "a" constituent is intended to include other constituents in addition to the one named.

Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Ranges may be expressed herein as from "about" or "approximately" or "substantially" one particular value and/or to "about" or "approximately" or "substantially" another particular value. When such a range is expressed, other exemplary embodiments include from the one particular value and/or to the other particular value.

Herein, the use of terms such as "having," "has," "including," or "includes" are open-ended and are intended to have the same meaning as terms such as "comprising" or "comprises" and not preclude the presence of other structure, material, or acts. Similarly, though the use of terms such as "can" or "may" are intended to be open-ended and to reflect that structure, material, or acts are not necessary, the failure to use such terms is not intended to reflect that structure, material, or acts are essential. To the extent that structure, material, or acts are presently considered to be essential, they are identified as such.

It is also to be understood that the mention of one or more method steps does not preclude the presence of additional method steps or intervening method steps between those steps expressly identified. Moreover, although the term "step" may be used herein to connote different aspects of methods employed, the term should not be interpreted as implying any particular order among or between various steps herein disclosed unless and except when the order of individual steps is explicitly required.

The components described hereinafter as making up various elements of the invention are intended to be illustrative and not restrictive. Many suitable components that would perform the same or similar functions as the components described herein are intended to be embraced within the scope of the invention. Such other components not described herein can include, but are not limited to, for example, similar components that are developed after development of the presently disclosed subject matter.

To facilitate an understanding of the principles and features of the invention, various illustrative embodiments are explained below. In particular, the presently disclosed subject matter is described in the context of logic devices. The present invention, however, is not so limited, and can be applicable in other contexts. For example, and not limitation, some embodiments of the present invention may improve sensor technologies, MEMS, memory devices, and the like. These embodiments are contemplated within the scope of the present invention. Accordingly, when the present invention is described in the context of logic devices, it will be understood that other embodiments can take the place of those referred to FIG. 1A depicts a single-stack coupled logic device 100 in accordance with an embodiment. In this embodiment, the logic device comprises a plurality of layers, including an input electrode 101, antiferromagnetic layer (AFM) 102, a first free magnet 103, a ground electrode 104, a first isolation layer 105, a second free magnet 106, an output electrode 107, second isolation layer 108, first permanent magnet 109, first digital input electrode 110, second permanent magnet 111, and second digital input electrode 112.

In some embodiments, the device operates in two stages. In the write stage, a voltage between the ground electrode 104 and input electrode 101 create an electric field within the AFM layer 102. The AFM layer 102 produces a magnetic field in response to the electric field with a polarity determined by the direction of the electric field. The first free magnet 103 becomes magnetized by the magnetic field produced by the AFM layer 102.

In the second stage, an MTJ is positioned in proximity to the write stage, such that the second free magnet 106 of the MTJ is in magnetic communication with the first free magnet 103 of the write stage. Two fixed ferromagnets 109, 111 with opposite magnetic orientations (depicted by arrows) on top of an insulating layer are placed on top of the second free output magnet 106. The permanent magnets 109, 111, insulating layer 108, and free magnet 106 form two MTJs. The two MTJs are connected to two supply voltages 110 and 112. The two permanent magnets are configured to produce opposing magnetic fields, such that the magnetoresistance between the supply voltages 110 and 112 and ground are opposite. In other words, the resistance path to the current flowing from the voltage electrodes connected to the permanent magnets to the ground contact are different due to the orientation of the two permanent magnets. As would be recognized by a person having ordinary skill in the art, opposite voltage polarities refer to polarization relative to the ground electrode 104. In some embodiments, the second isolation layer 108 is configured to prevent conduction, but thin enough to permit electron tunneling.

In other embodiments, the second isolation layer is configured to allow electricity to be conducted from the permanent magnet to the second free magnet. For each MTJ, if the polarity of the permanent magnet is substantially parallel to the polarity of the free magnet, the voltage from the supply voltage corresponding to that MTJ can be sensed at the output electrode 107. In contrast, if the polarity of the permanent magnet is antiparallel from the orientation of the free magnet, the MTJ will be put in a high-resistance state, and the corresponding supply voltage will not be detectable from the output electrode 107.

In some embodiments, the first free magnet 103 is coupled to the second free magnet 106. This coupling can be provided via dipolar coupling, exchange coupling, or through an insulating ferromagnet. The first free magnet and second free magnet are separated by a first isolation layer. The first isolation layer 108 between the first and second free magnets 103, 106 can be 2-3× thicker than the permanent magnet insulating layer 108 in the MTJs to minimize leakage current between the input and output stages. The voltage at the output can directly drive the input of the next stage without using auxiliary field-effect transistors or any clocking scheme.

FIG. 1B depicts an example layout 150 of the logic device of FIG. 1A. The layout includes an AFM contact pad 151 for the AFM layer 102; a first free magnet contact pad 152 for the first free magnet 103; a second free magnet contact pad 153 for the second free magnet 106; a first supply voltage contact pad 154 for the first supply voltage 110; and a second supply voltage contact pad 155 for the second supply voltage 112.

A majority gate can be formed by connecting a plurality of inputs directly to the AFM Layer 102. In some embodiments, connecting multiple inputs to the same AFM layer may cause different portions of the AFM layer to produce different magnetic fields, particularly when not all inputs are the same. In some embodiments, this challenge can be overcome by producing a two-stage majority gate with four basic MEMTJ devices.

FIG. 2A depicts a two-stage majority gate in accordance with an embodiment. At the first stage, each input 201, 202, 203 is connected to an MEMTJ device. The outputs are connected together and fed into the input of MEMTJ device 204. The majority of the inputs determines the polarity of the merged output 204, which drives the fourth device used as a buffer to amplify the small input voltage to a large output voltage at output 205.

FIG. 2B depicts an example layout 250 of the logic device of FIG. 2A. The layout includes four MEMTJs 251, 252, 253, and 254. The first three MEMTJs 251, 252, 253 correspond to the three input MEMTJs of the majority gate 201, 202, 203 in FIG. 2A. The last MEMTJ 254 corresponds to the output MEMTJ 205 of the majority gate of FIG. 2A. Each MEMTJ includes a AFM contact pads 255, a first free magnet contact pad 256; a second free magnet contact pad 257; a first supply voltage contact pad 258 for the first supply voltage; and a second supply voltage contact pad 259 for the second supply voltage. A majority gate can be formed by connecting the first supply voltage pads 259 of each MEMTJ together, and providing a first supply voltage, connecting the second supply voltage pads 2258 of each MEMTJ together, and providing a second supply voltage, and connecting the first free magnet pads 256 of each MEMTJ to ground. The second free magnet contact 257, which serves as the output of each MEMTJ, of the first three MEMTJs 251, 252, 253 are connected together, and further connected to the AFM contact pad 255 of the fourth MEMTJ 254, as shown. The output provided at the second free magnet contact pad 257 of the fourth MEMTJ 254 provides the majority input provided to the AFM contact pads 255 of each of the first three MEMTJs.

Figure 3:
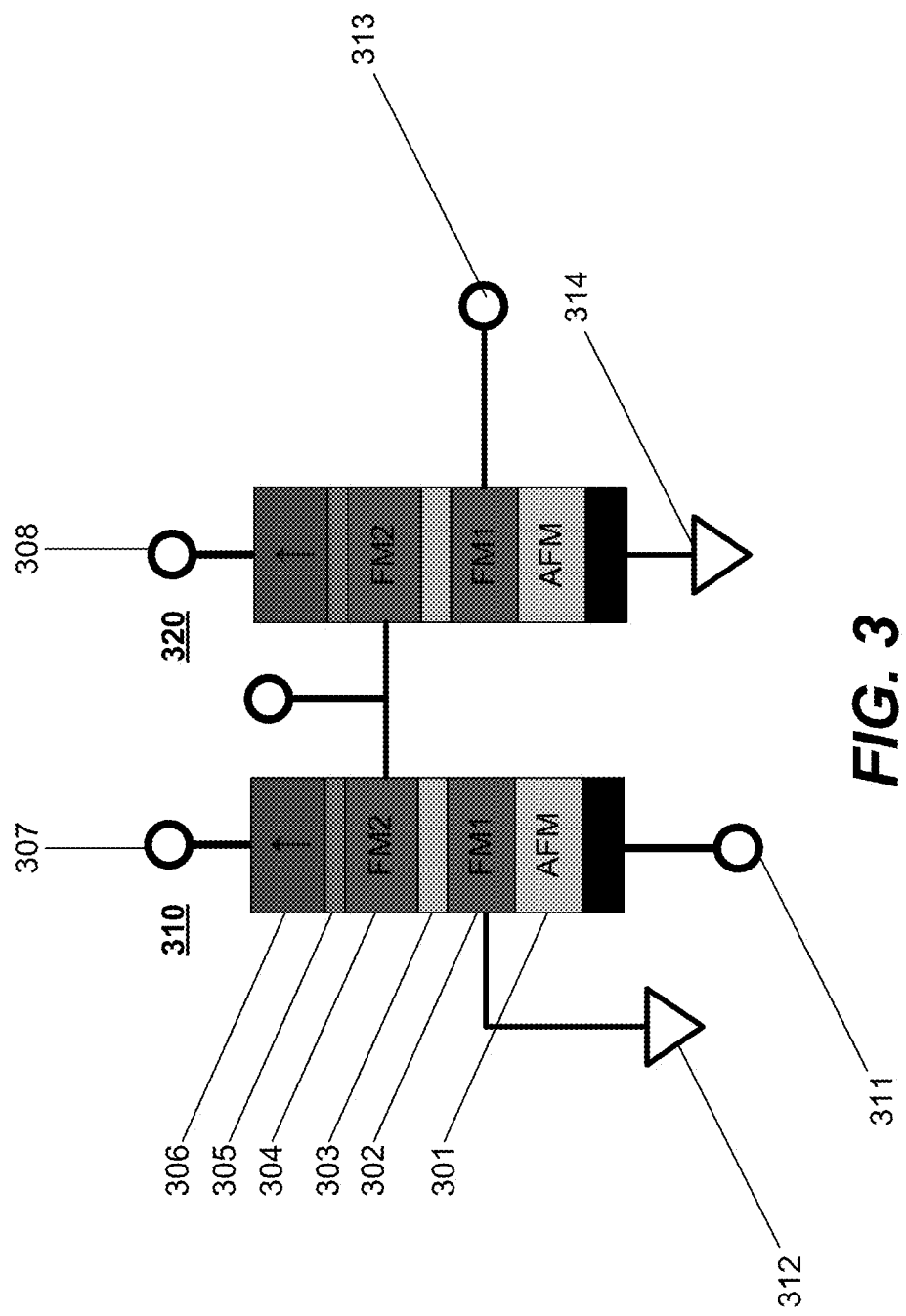
FIG. 3 depicts an MEMTJ device in accordance with an embodiment.

FIG. 3 shows an alternative device structure that separates the pull-up and pull-down networks. For some applications, it may be advantageous to build top MTJs with permanent magnets having similar orientations. Such a device comprises two similar logic devices 310 and 320, including an antiferromagnetic material layer 301, a first free magnet 302, a first isolation layer 303, a second free magnet 304, a second isolation layer 305, and a permanent magnet 306. A first digital voltage is applied to electrode 307 and a second digital voltage is applied to electrode 308. The first digital voltage has an opposite polarity than the second digital voltage relative to ground. One logic device has an input electrode 311 connected to the antiferromagnetic layer, and a ground electrode 312 connected to the first free magnet. The other logic device reverses the inputs and ground electrodes, such that the input electrode 313 is connected to the first free magnet, and the ground electrode 314 is connected to the antiferromagnetic layer. Each single device now comprises two separated heterostructures (a single MTJ built on top of the first free magnet 303). For a given input voltage, electrical fields with opposite directions are generated across the AFMs and switch the first free magnets to opposite orientations. The two second free magnets are coupled with the two first free magnets in the same manner as those in FIG. 1A. With the complementary magnet states, identical fixed magnets can be utilized to achieve the same logic functionality as the one shown in FIG. 1A.

Figures 4A, 4B:
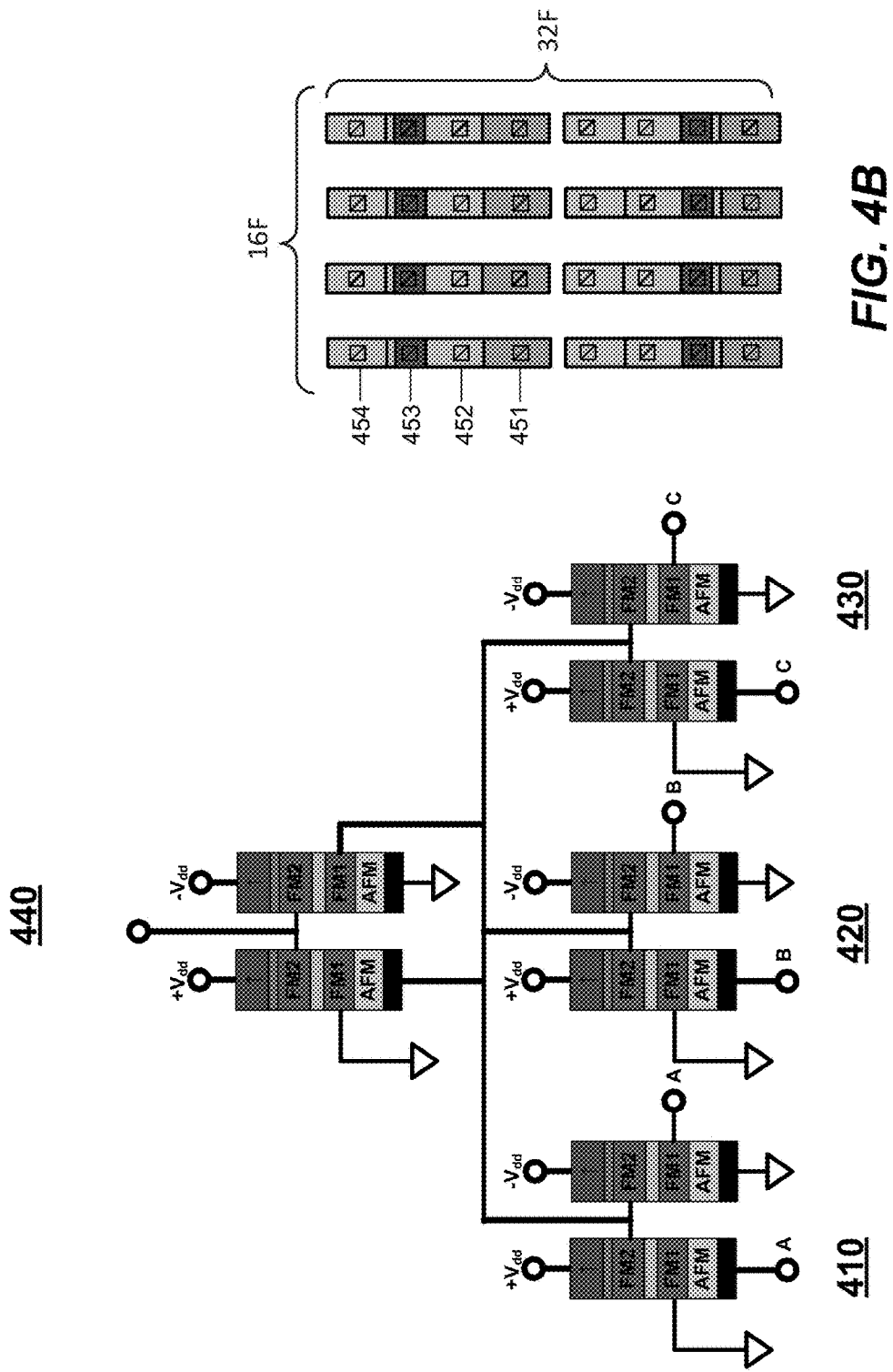
FIG. 4A depicts a majority gate composed of the logic gates of FIG. 3 in accordance with an embodiment.
FIG. 4B depicts layout of the majority gate of FIG. 4A on a substrate in accordance with an embodiment.

FIG. 4A illustrates a majority gate in accordance with an embodiment formed using the logic devices of FIG. 4A. The outputs of logic devices 410, 420, and 430 are fed into the inputs of logic device 440. Logic device 440 serves as a buffer and amplifies the output of the overall majority gate.

The device of FIG. 4A can be fabricated on a substrate with the layout depicted in FIG. 4B. The layout includes a contact pad 451 for the AFM layer, a contact pad 452 for the first free magnet, a contact pad 453 for the digital input voltage, and a contact pad 454 for the output.

Instead of using spin-transfer-torque (STT) as the switching mechanism, MEMTJ devices can rely on voltage controlled magnetoelectric (exchange bias) effect. For the write unit (AFM/FM1), the heterostructure of $Cr_2O_3/CoPd$ has been demonstrated to exhibit a switchable exchange bias field of around 9 mT with an applied electric field of 2.6 MV/m. The input voltage is calculated by $E_{me}=V_{in}/t_{me}$, where $t_{me}$ is the thickness of the magnetoelectric material at a value of 10 nm. The corresponding magnetic field applied on the magnet due to the exchange bias effect is estimated as $H_{app}=(B_{me}/E_c\mu_0)E_{me}$, where the critical field $E_C$=2.6 MV/m, and the magnetoelectric exchange bias field $B_{me}$=9 mT. The magnet switching time $t_{mag}$ is simulated by solving the single domain Landau-Lifshitz-Gilbert (LLG) equation for FM1. We assume perfect coupling between FM1 and FM2 and hence no additional delay for switching of FM2.

The delay for an inverter or a majority gate is comprised of the magnet switching time $t_{mag}$ and the electrical RC delay based on the RC network illustrated in FIG. 5A-B, where $C_{AFM}$ is the capacitance of the antiferromagnetic material at a dielectric constant of 12, and $R_P$ and $R_{AP}$ are the parallel and antiparallel resistance of an MTJ. Since the maximum TMR observed in the experimental work is 604% at room temperature, MTJs with TMR values up to 10 are investigated in this letter. The worst-case scenario is considered for the majority gate, where one of the inputs is opposite to the others. The energy per operation include 1) the dynamic switching energy during charging and discharging the AFM and 2) the leakage energy associated with the current flowing from $+V_{dd}$ to $-V_{dd}$.

Based on the modeling approach described above, the delay, energy dissipation, and energy-delay product (EDP) are evaluated and shown in FIG. 6A-C by sweeping the oxide thickness at three different TMR values at a $V_{dd}$ of 0.3 V. For a small oxide thickness, the MTJ resistance is relatively small. Thus, the delay is dominated by the magnet switching time, and the leakage energy dominates the overall energy dissipation due to the large leakage current. As the oxide thickness increases beyond a certain point, the delay increases exponentially due to the significantly large resistance-area product of the MTJ. The energy dissipation becomes dominated by the switching energy associated with charging and discharging the AFM. As a result, optimal tunneling oxide thicknesses exist to minimize the overall EDP.

FIGS. 6A-C illustrate the delay, energy dissipation, and EDP versus the oxide thickness of the MTJ based on three TMR values at $V_{dd}$ of 0.3 V. FIGS. 6D-E depict the EDP of an inverter 540 and a majority gate 550 versus the supply voltage based on three TMR values.

For the majority gate, both delay and energy are larger compared to an inverter or buffer, leading to about one order of magnitude larger EDP. In addition, a thicker tunneling oxide is preferred for a majority gate to achieve the minimum EDP. This is because at the worst-case scenario, both pull-up and pull-down resistance networks have at least one MTJ at the parallel configuration, making the energy dissipation larger but faster. Thus, MTJs with thicker oxide better balance the overall delay and energy. For various $V_{dd}$ values, the minimal EDP at optimal oxide thickness for the inverter and majority gate are shown at 540 and 550. As the $V_{dd}$ decreases, the optimal EDP keeps decreasing, but if the $V_{dd}$ is too low, the EDP saturates and even increases, especially for the majority gate. Since the output voltage swing of the majority gate is smaller compared to a single inverter, if the $V_{dd}$ is not large enough to reach the critical switching field, the magnet fails to switch, and the corresponding EDP becomes null.

Figure 7:
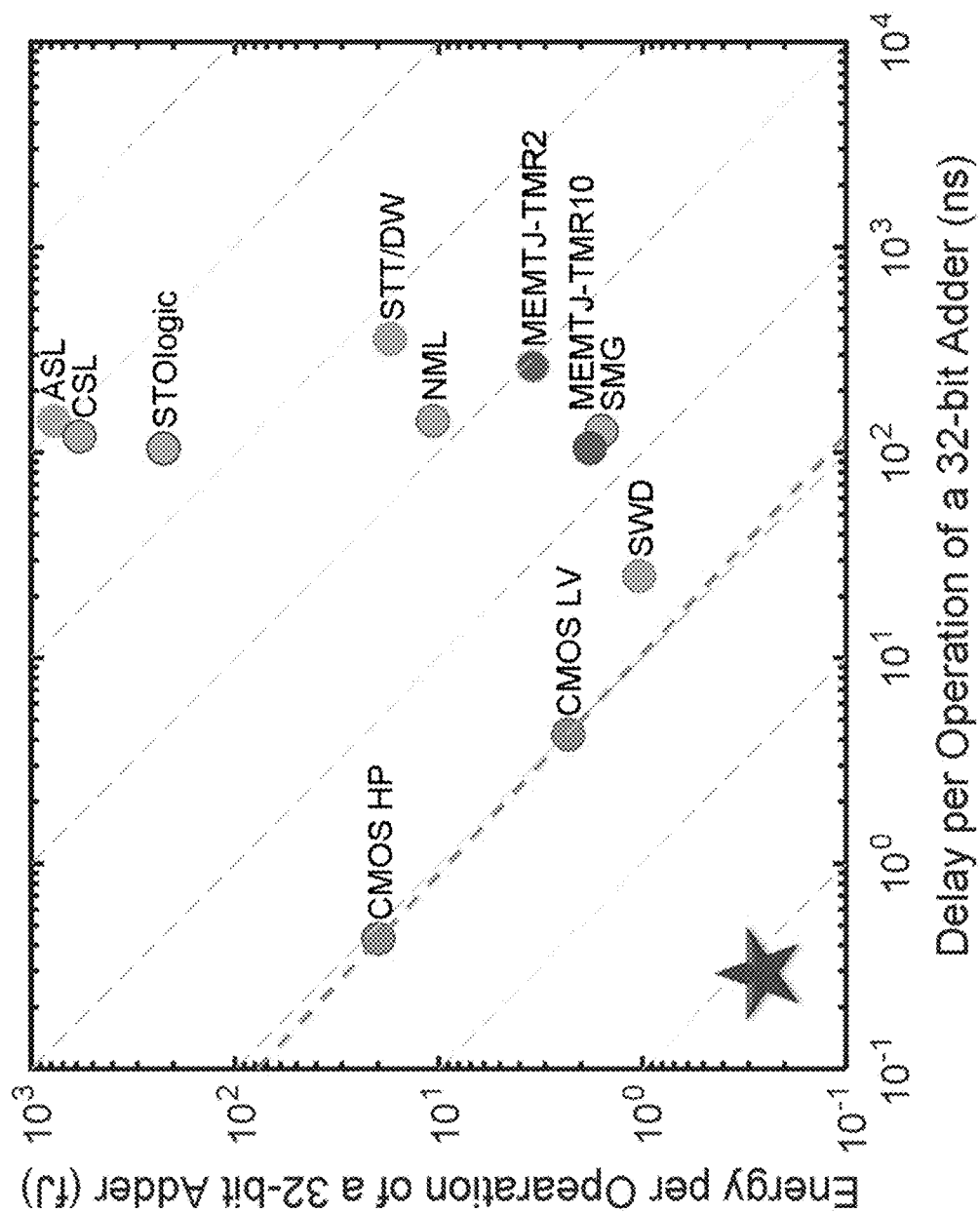
FIG. 7 is a graph of the energy and delay per operation of a 32-bit adder using a variety of logic device technologies.

To compare MEMTJ devices with other spintronic devices and the conventional CMOS devices, a uniform benchmarking methodology is implemented to analyze a 32-bit adder in terms of the circuit-level performance, shown in FIG. 7. In general, spintronic devices are slower due to the limitation of the magnet switching delay. The voltage-controlled devices, including the spin-wave device (SWD), spin majority gate device (SMG), nanomagnetic logic (NML), and proposed MEMTJ devices, consume much less energy compared to the current-driven devices, such as the all-spin logic (ASL) and charge-spin logic (CSL) devices. The circuit using high-TMR MEMTJ devices provides about 2× improvement in delay and energy dissipation compared to its low-TMR counterpart because 1) the larger output swing creates a larger exchange bias effect, which switches the magnet faster and 2) the supply voltage for the low-TMR device needs to be increased so that the output voltage is larger than the required critical voltage, as can be observed in FIG. 6E. As the TMR increases, the performance of MEMTJ is expected to be further improved.

Figures 8A, 8B:
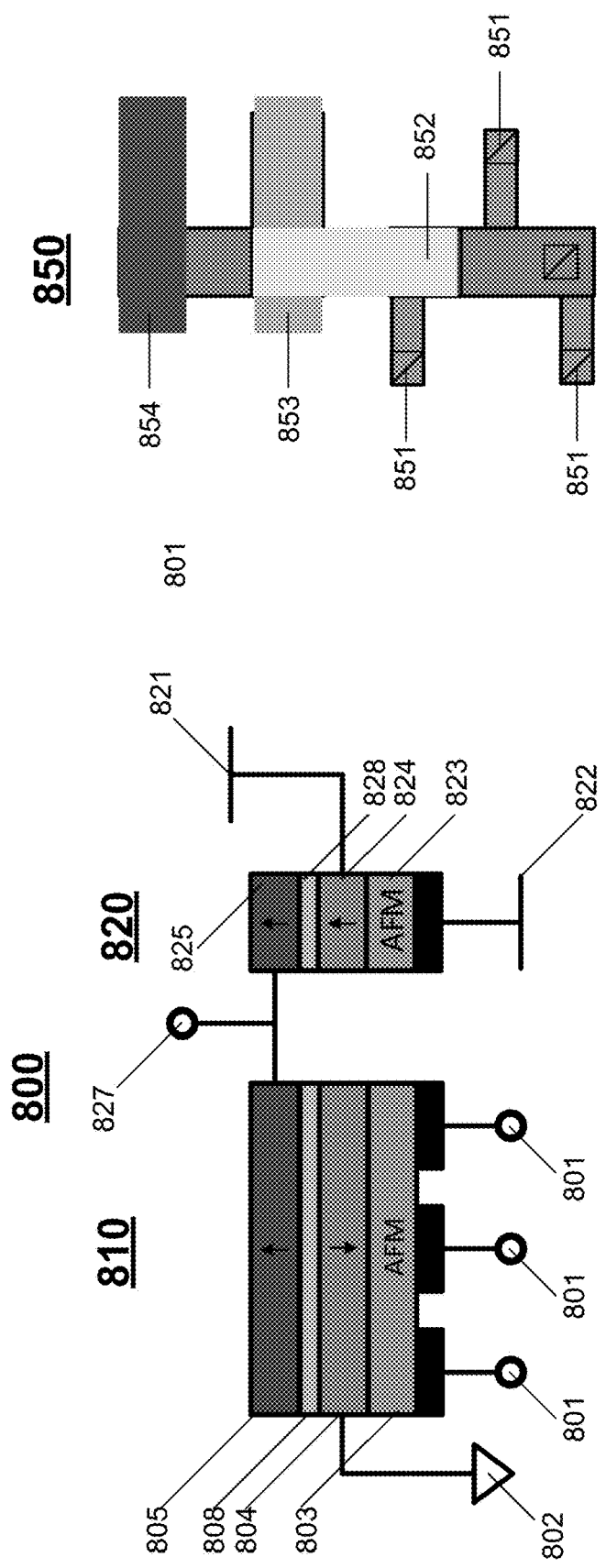
FIG. 8A depicts a majority gate in accordance with an embodiment.
FIG. 8B depicts a layout of the majority gate of FIG. 6A on a substrate in accordance with an embodiment.

FIG. 8A-B illustrate an alternative embodiment logic device 800 for a pre-set-based voltage-controlled MEMTJ. This embodiment comprises two components, a logic component 810 and a bias component 820. The logic component 810 comprises one or more input electrodes 801 and a ground electrode 802 configured to produce an electric field within a layer of antiferromagnetic material 803 that produces a magnetic field in response to the application of an electric field. The device further comprises a first free magnet 804 and a second free magnet 805, separated by a first isolation layer 806. The first free magnet 804 is located in proximity and magnetic communication with the antiferromagnetic material 803, such that the first free magnet 804 produces a magnetic field in response to the magnetic field produced by the antiferromagnetic material 803. The logic component further comprises an output electrode 806 connected to the second free magnet 805.

The device further comprises a bias component 820. The bias component includes a first pre-set electrode 821 and a second pre-set electrode 822 configured to produce an electric field within a layer of antiferromagnetic material 823 that produces a magnetic field in response to the application of an electric field. The bias component further comprises a free magnet 824 and a permanent magnet 825, wherein the free magnet 824 and a permanent 825 are separated by a first isolation layer 826. The free magnet is placed such that it responds to magnetic fields produced by the layer of antiferromagnetic material 823. The bias component further has an output electrode 806 connected to the permanent magnet 825 of the logic component. The output electrode of the logic component 810 and bias component 820 are connected together at one output node 827.

In normal operation, the first pre-set electrode is set to an operating voltage, and the second pre-set electrode is set to a voltage having the same polarity and greater magnitude than the first pre-set electrode, relative to ground. This produces an electric field in the bias component that causes the antiferromagnetic layer to produce a magnetic field with a similar orientation to that of the permanent magnet. This causes the free magnet to magnetize in a similar polarity, allowing current to flow from the first pre-set electrode 821 to output node 827.

In the logic component, the free magnet 804 is initially biased in an opposite direction to the permanent magnet 805 of the logic component 810. A logic voltage can then be applied to the input nodes 801, where one state is a ground voltage, and the other is a non-zero voltage. The voltage at the output node is thus set by voltage division, dividing the voltage at the first pre-set electrode 821 over the resistance of the bias component 820 and the logic component 810. When the logic component is in a highly resistive state, the voltage at the output node will have some value between ground and the voltage at the first pre-set electrode. When the logic component is in a low resistance state, the output voltage is closer to a ground voltage. The difference between these two states creates a logic high and low signal at the output node 827.

FIG. 8B depicts an example layout 850 for the logic device 800 of FIG. 6A. The layout includes three contact pads 851 for the inputs to the AFM layer, a contact pad 852 for the output of the logic device and bias device, a contact pad 853 for the first pre-set input voltage, and a contact pad 854 for the second pre-set input voltage.

In some embodiments, the free magnet in the logic component can only be switched to parallel during operation. Therefore, the free magnet of the logic component must be pre-set to an antiparallel state. This can be accomplished using a pre-set technique. During the pre-set, a voltage is applied to the first pre-set electrode with an opposite polarity to the operating voltage, and a ground voltage is applied to the second pre-set electrode. This produces an electric field having the same orientation in the bias component, causing the magnetic fields of the free magnet and permanent magnet of the bias component to have a similar orientation. The opposite polarity voltage at the first pre-set node causes an electric field across the antiferromagnetic layer of the logic component which causes a magnetization of the free magnet of the logic device in an opposite polarity to the permanent magnet of the logic component.

In the case of a logic device with a single input electrode, the application of a ground voltage to the input electrode causes no significant electric field within the antiferromagnetic layer. Because the free magnet is biased with an opposite polarity to that of the permanent magnet, the magnetic fields of the permanent magnet and the free magnet are oppositely directed in this state, causing the logic device to have a higher resistivity between the output node, through the permanent magnet and free magnet to ground.

Figure 9A:
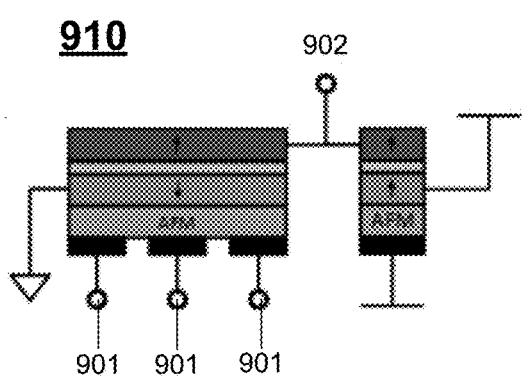
FIG. 9A depicts a majority gate in accordance with an embodiment.

FIG. 9A illustrates an embodiment of the logic device of FIG. 6A configured as a majority gate 910. The device has three inputs 901, and a single output 902. The output will output a digital voltage when a digital voltage is applied to more than two of the inputs 901, and a ground voltage when ground is applied to two or more of the inputs 901.

Figure 9B:
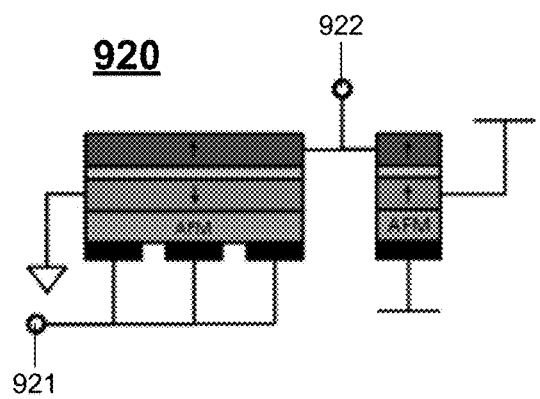
FIG. 9B depicts an inverter in accordance with an embodiment.

FIG. 9B illustrates an embodiment of the logic device of FIG. 6A configured as an inverter 920. The device has a single input 921 and a single output 922. The output will output a digital voltage when a ground voltage is applied to the input 901, and a ground voltage when a digital voltage is applied to the input 901.

Figure 9C:
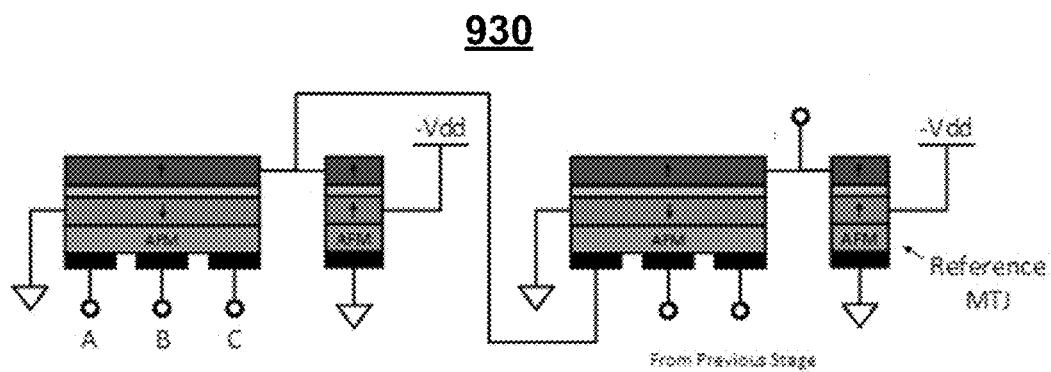
FIG. 9C illustrates a pre-set cycle of two majority gates connected together in accordance with an embodiment.

FIG. 9C illustrates the operation for the preset-based MEMTJ. A matched MTJ drives the next stage with no need for dedicated FETs. A positive (negative) voltage with the amplitude above the critical switching value is applied to the input, the free magnet is set to have the same (opposite) magnetization as the top fixed magnet based on the exchange bias effect, leading to an MTJ with a parallel (anti-parallel) configuration.

During the preset period, a negative $V_{dd}$ is applied to the free magnet such that the voltage across the AFM is positive, setting the reference MTJ to the parallel state. With a proper setting of the supply voltage, the amplitude of the negative output voltage is larger than the critical voltage, presetting the input magnets of the next stage to antiparallel states.

During the computation period, the reference MTJ stays at the parallel state by raising both voltages applied on the AFM. The output voltage is a voltage division between the input and reference MTJs. The supply voltage is set such that the critical switching voltage is in the middle of the output voltages at the two inputs. Therefore, the output voltage is either larger or lower than the critical switching voltage, depending on the majority of the input voltage, which realizes the functionality of a majority gate. We connect all inputs together (or at least two of them) to achieve an inverter, as shown in FIG. 9B For a given input voltage, the electrical field is calculated by $E_{me}=V_{in}/t_{me}$, where $t_{me}$ is the thickness of the magneto-electric material at a value of 10 nm. The corresponding magnetic field applied to the magnet due to the exchange bias effect follows BCB 3.0 and is estimated as $H_{app}=(B_{me}/E_c\mu_0)E_{me}$, where the electrical field, $E_C$, is 2.6 MV/m, and the magnetoelectric exchange bias field, $B_{me}$, is 9 mT, giving an ME coefficient of 3.26 ns/m. The magnet switching time $t_{mag}$ is simulated by the Landau-Lifshitz-Gilbert (LLG) equation.

Figures 10A, 10B, 10C:
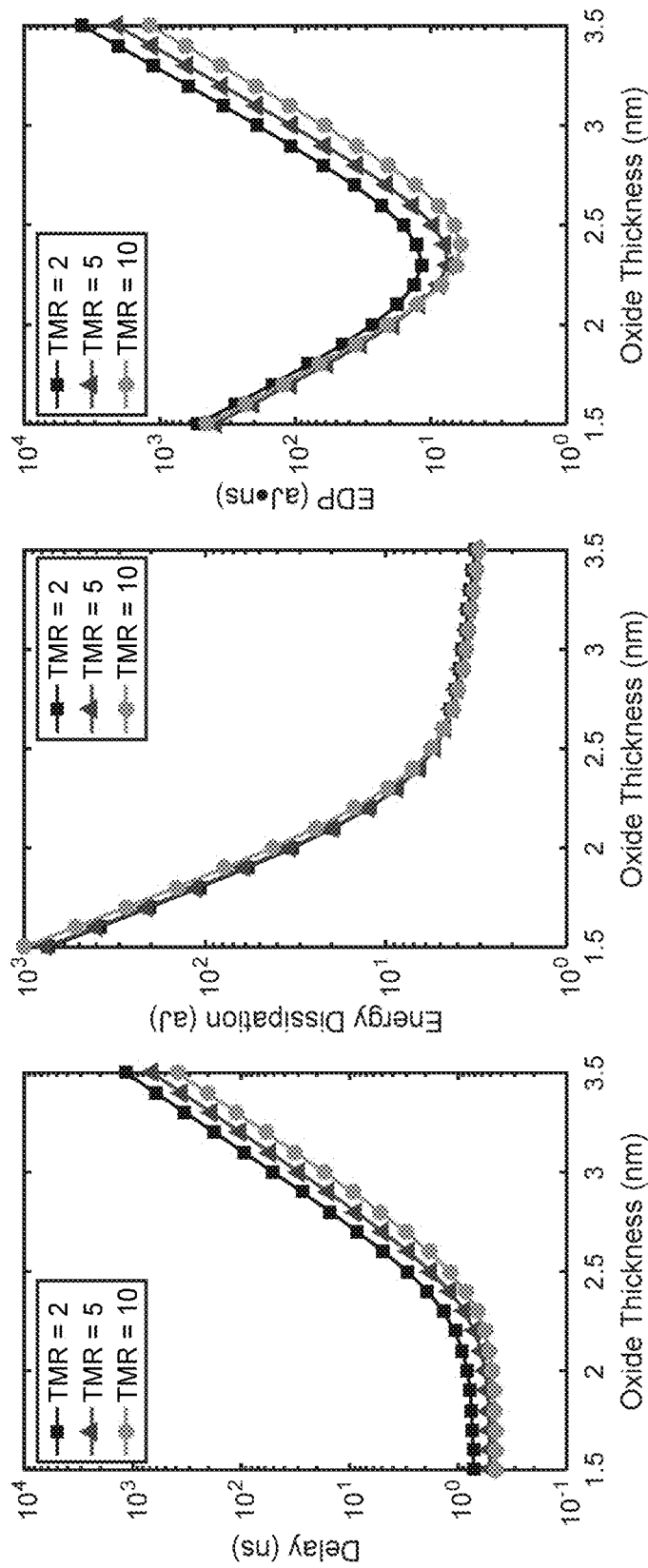
FIG. 10A depicts the propagation delay of MEMTJs in accordance with embodiments.
FIG. 10B depicts the energy dissipation of MEMTJs in accordance with embodiments.
FIG. 10C depicts the energy delay product of MEMTJs in accordance with embodiments.

FIGS. 10A-C illustrate the delay 510, energy dissipation 520, and EDP 530 versus the oxide thickness of the MTJ based on three TMR values at $V_{dd}$ of 0.3 V.

While the present disclosure has been described in connection with a plurality of exemplary aspects, as illustrated in the various figures and discussed above, it is understood that other similar aspects can be used or modifications and additions can be made to the described aspects for performing the same function of the present disclosure without deviating therefrom. For example, in various aspects of the disclosure, methods and compositions were described according to aspects of the presently disclosed subject matter. However, other equivalent methods or composition to these described aspects are also contemplated by the teachings herein. Therefore, the present disclosure should not be limited to any single aspect, but rather construed in breadth and scope in accordance with the appended claims.

The invention claimed is:

1. A semiconductor device comprising:
a first logic device comprising:
a first input electrode and a first ground electrode configured to produce an electric field within a first layer of antiferromagnetic material when a voltage is applied to the first input electrode relative to the first ground electrode, wherein the first layer of antiferromagnetic material produces a magnetic field in response to an application of an electric field;
a first set of a first free magnet and a second free magnet, wherein the first set of first and second free magnets are separated by a first isolation layer, wherein the first set first free magnet is in magnetic communication with the first layer of antiferromagnetic material, and wherein the first set second free magnet is in magnetic communication with the first set first free magnet;
a first permanent magnet separated from the first set second free magnet by a second isolation layer;
a first digital voltage electrode in electrical communication with the first permanent magnet; and
a first output electrode in electrical communication with the first set second tree magnet;
a second logic device comprising:
a second input electrode and a second ground electrode configured to produce an electric field within a second layer of antiferromagnetic material when a voltage is applied to the second input electrode relative to the second ground electrode, wherein the second layer of antiferromagnetic material produces a magnetic field in response to an application of an electric field;
a second set of a first free magnet and a second free magnet, wherein the second set of first and second tree magnets are separated by a third isolation layer, wherein the second set first free magnet is in magnetic communication with the second layer of antiferromagnetic material, and wherein the second set second free magnet is in magnetic communication with the second set first free magnet;
a second permanent magnet separated from the second set second free magnet by a fourth isolation layer;
a second digital voltage electrode in electrical communication with the second set second permanent magnet; and
a second output electrode in electrical communication with the second set second free magnet;
wherein the first input electrode is in electrical communication with the first antiferromagnetic layer, and the first ground electrode is in electrical communication with the first set first free magnet;
wherein the second input electrode is in electrical communication with the second set first free magnet, and the second ground electrode is in electrical communication with the second antiferromagnetic layer; and wherein the first output electrode is in electrical communication with the second output electrode.

2. The semiconductor device of claim 1, wherein the semiconductor device is configured such that when a first digital voltage applied to the first input electrode, and a second digital voltage applied to the second input electrode, wherein the first digital voltage has an opposite polarity than the second digital voltage relative to ground, wherein electrical fields with opposite directions are generated across the first and second layers of antiferromagnetic material, and wherein the first set first free magnet and the second set first free magnet are switched to opposite orientations.

3. The semiconductor device of claim 1, wherein the first and second set second free magnets are magnetically coupled to the respective first and second set first free magnets;
wherein the first permanent magnet is in contact with the second isolation layer;
wherein the second permanent magnet is in contact with the fourth isolation layer;
wherein the second isolation layer is in contact with the first set second free magnet; and
wherein the fourth isolation layer is in contact with the second set second free magnet.

4. The semiconductor device of claim 1, wherein the first set second free magnet is coupled to the first set first free magnet by exchange coupling.

5. The semiconductor device of claim 1, wherein the second set second free magnet is coupled to the second set first free magnet by exchange coupling.

6. The semiconductor device of claim 1, wherein the first set second free magnet is coupled to the first set first free magnet by dipole coupling.

7. The semiconductor device of claim 1, wherein the second set second free magnet is coupled to the second set first free magnet by dipole coupling.

8. The semiconductor device of claim 1, wherein the first isolation layer has a thickness selected to suppress leakage current from the first input electrode to the first ground electrode.

9. The semiconductor device of claim 1, wherein the third isolation layer has a thickness selected to suppress leakage current from the second input electrode to the second ground electrode.

10. The semiconductor device of claim 1, wherein the second isolation layer has a thickness selected to permit electron tunneling between the first input electrode and the first output electrode when the polarity of the first permanent magnet and the first set second free magnet are similarly directed.

11. The semiconductor device of claim 1, wherein the fourth isolation layer has a thickness selected to permit electron tunneling between the second input electrode and the second output electrode when the polarity of the second permanent magnet and the second set second free magnet are similarly directed.

12. The semiconductor device of claim 1, wherein thicknesses of the first and third isolation layers are each approximately two times to three times a thickness of the second and fourth isolation layers, respectively.

13. The semiconductor device of claim 1, wherein each of the first and second permanent magnets comprise:
a layer comprised, at least in part, of an alloy of cobalt and iron; and
a layer comprised, at least in part, of an alloy of iridium and magnesium.

14. The semiconductor device of claim 1, wherein each of the first and second antiferromagnetic layers comprise a material selected from the group consisting of chromium oxide, bismuth ferrite, and combinations thereof.

15. The semiconductor device of claim 1, wherein each of the first and second set first free magnets comprise a material selected from the group consisting of cobalt iron alloys, cobalt palladium alloys, lanthanum strontium manganite, and combinations thereof.

16. The semiconductor device of claim 1, wherein each of the first and third isolation layers comprise a material selected from the group consisting of magnesium oxide, yttrium-aluminum-garnet, iron oxide, and combinations thereof.

17. The semiconductor device of claim 1, wherein each of the second and fourth isolation layers comprise a material selected from the group consisting of magnesium oxide, aluminum oxide, and combinations thereof.

* * * * *